(12) United States Patent
Beretich

(10) Patent No.: US 9,865,793 B2
(45) Date of Patent: Jan. 9, 2018

(54) METHOD OF FORMING A THERMALLY ENHANCED ENERGY GENERATOR

(75) Inventor: Thomas McPhail Beretich, Albuquerque, NM (US)

(73) Assignee: Conceptual Werks LLC, Buffalo, WY (US)

( * ) Notice: Subject to any disclaimer, the term of this patent is extended or adjusted under 35 U.S.C. 154(b) by 746 days.

(21) Appl. No.: 11/543,001

(22) Filed: Oct. 4, 2006

(65) Prior Publication Data

US 2008/0083444 A1 Apr. 10, 2008

Related U.S. Application Data

(60) Provisional application No. 60/723,696, filed on Oct. 5, 2005.

(51) Int. Cl.
| | |
|---|---|
| *H01L 21/00* | (2006.01) |
| *B05D 1/32* | (2006.01) |
| *H01L 35/34* | (2006.01) |
| *H01L 35/30* | (2006.01) |
| *H01L 37/00* | (2006.01) |
| *H01L 35/02* | (2006.01) |
| *H01L 35/08* | (2006.01) |

(Continued)

(52) U.S. Cl.
CPC ............... *H01L 35/34* (2013.01); *H01L 35/00* (2013.01); *H01L 35/02* (2013.01); *H01L 35/22* (2013.01); *H01L 35/28* (2013.01); *H01M 6/36* (2013.01); *H01M 14/00* (2013.01); *H01G 9/02* (2013.01); *H01G 9/04* (2013.01); *H01G 9/21* (2013.01)

(58) Field of Classification Search
CPC ......... H01L 35/00; H01L 35/04; H01L 35/12; H01L 35/22; H01L 35/32; H01L 35/34; H01M 6/36

USPC ....... 136/205, 251, 259, 263, 200, 201, 232, 136/237, 239, 241; 429/111–112, 231.8; 361/502–503; 257/43, 467, 40, 257/E51.001–E51.052, E31.001–E31.031; 252/62.2, 511–514; 427/466; 438/54, 55
See application file for complete search history.

(56) References Cited

U.S. PATENT DOCUMENTS

| | | | |
|---|---|---|---|
| 2,115,828 A | 5/1938 | Prescott | |
| 2,534,403 A * | 12/1950 | Blake et al. | .................. 429/219 |

(Continued)

FOREIGN PATENT DOCUMENTS

| | | |
|---|---|---|
| GB | 1173605 | 12/1969 |
| WO | 2007/044400 | 4/2007 |

OTHER PUBLICATIONS

S.B.Riffat, Xiaoli Ma: "Thermoelectrics: a review of present and potential applications" Applied Thermal Engineering, 2003, pp. 913-935, vol. 23, Elsevier Science Ltd., XP002419465.

(Continued)

*Primary Examiner* — Lindsey Bernier

(57) ABSTRACT

A method for forming an energy generating device which includes two layers of dissimilar materials in terms of electron density and configuration in contact with each other, sandwiched between an anode and a cathode. The two layers of dissimilar materials are each formed as a paste or ink and include an ionic material absorbed or incorporated into the two layers of dissimilar material. The ionic material facilitates the flow of electrons within the device, thereby creating a cell with an electric potential across an interface of the two layers of dissimilar material.

16 Claims, 8 Drawing Sheets

(51) Int. Cl.
*H01L 35/14* (2006.01)
*H01L 35/20* (2006.01)
*H01M 6/36* (2006.01)
*H01L 35/00* (2006.01)
*H01L 35/22* (2006.01)
*H01M 14/00* (2006.01)
*H01L 35/28* (2006.01)
*H01G 9/02* (2006.01)
*H01G 9/04* (2006.01)
*H01G 9/21* (2006.01)

(56) References Cited

U.S. PATENT DOCUMENTS

| | | | | |
|---|---|---|---|---|
| 2,938,357 | A | * | 5/1960 | Sheckler ............ 62/3.2 |
| 3,197,342 | A | * | 7/1965 | Neild, Jr. ............ 136/210 |
| 4,021,323 | A | | 5/1977 | Kilby et al. |
| 4,112,347 | A | | 9/1978 | Moerman |
| 4,125,122 | A | | 11/1978 | Stachurski |
| 5,114,743 | A | | 5/1992 | Weber |
| 5,219,680 | A | * | 6/1993 | Fauteux ............ 429/306 |
| 5,314,507 | A | | 5/1994 | Rossoll |
| 5,344,498 | A | * | 9/1994 | Inoue ............ 136/251 |
| 5,487,790 | A | | 1/1996 | Yasuda |
| 5,487,957 | A | | 1/1996 | Gourdine |
| 5,707,458 | A | * | 1/1998 | Nagashima et al. ........ 136/246 |
| 6,057,050 | A | | 5/2000 | Parise |
| 6,107,645 | A | * | 8/2000 | Hidaka ............ 257/84 |
| 6,150,605 | A | * | 11/2000 | Han ............ 136/263 |
| 6,166,317 | A | | 12/2000 | Volk, Jr. |
| 6,291,763 | B1 | | 9/2001 | Nakamura |
| 6,297,495 | B1 | | 10/2001 | Bulovic et al. |
| 6,717,043 | B2 | * | 4/2004 | Hasegawa et al. .......... 136/205 |
| 2001/0032665 | A1 | | 10/2001 | Han et al. |
| 2002/0031706 | A1 | * | 3/2002 | Dasgupta et al. ............ 429/212 |
| 2002/0038664 | A1 | * | 4/2002 | Zenko ............... B32B 17/10743 136/251 |
| 2002/0040728 | A1 | * | 4/2002 | Yoshikawa .................. 136/263 |
| 2003/0040336 | A1 | | 2/2003 | Waylett et al. |
| 2003/0164188 | A1 | * | 9/2003 | Murai et al. .................. 136/263 |
| 2004/0031514 | A1 | | 2/2004 | Bell |
| 2004/0129308 | A1 | | 7/2004 | Luong et al. |
| 2004/0261830 | A1 | | 12/2004 | Sharp et al. |
| 2005/0098204 | A1 | * | 5/2005 | Roscheisen et al. ......... 136/263 |
| 2005/0098205 | A1 | * | 5/2005 | Roscheisen ............ B82Y 10/00 136/263 |
| 2005/0183769 | A1 | * | 8/2005 | Nakagawa et al. ........... 136/263 |
| 2007/0109121 | A1 | | 5/2007 | Cohen |
| 2008/0083444 | A1 | | 4/2008 | Beretich |
| 2010/0065096 | A1 | | 3/2010 | Pellegrini |
| 2011/0171500 | A1 | | 7/2011 | Yamanaka et al. |
| 2011/0198666 | A1 | | 8/2011 | Prakash et al. |
| 2013/0045426 | A1 | | 2/2013 | Rosciano et al. |
| 2013/0228206 | A1 | | 9/2013 | Beretich |
| 2013/0263904 | A1 | | 10/2013 | Beretich |
| 2013/0263905 | A1 | | 10/2013 | Beretich |

OTHER PUBLICATIONS

PCT Written Opinion of the International Searching Authority and International Search Report issued in related Application No. PCT/US14/28529 dated Aug. 11, 2014, 9 pages.
PCT Written Opinion of the International Searching Authority and International Search Report issued in related Application No. PCT/US14/25122 dated Jul. 14, 2014, 5 pages.
PCT Written Opinion of the International Searching Authority and International Search Report issued in related Application No. PCT/US14/28716 dated Aug. 21, 2014, 5 pages.

\* cited by examiner

METHOD OF FORMING A THERMALLY ENHANCED ENERGY GENERATOR

CROSS-REFERENCE TO RELATED APPLICATIONS

This application claims the benefit of priority to U.S. Provisional Application No. 60/723,696 filed on Oct. 5, 2005.

FEDERALLY SPONSORED RESEARCH

Not Applicable

SEQUENCE LISTING

Not Applicable

BACKGROUND OF THE INVENTION

Field of Invention

This invention relates to the generation of electric energy by a solid-state device and more particularly, by the use as a voltage source of thermally enhanced, built-in potentials arising at the junction between dissimilar materials including metals, semiconductors, ceramics (oxides, carbides, etc.) and carbons (graphite, charcoal).

Discussion of Prior Art

Electrical power generation devices use power inputs including, but not limited to electromagnetic waves (sunlight, infrared light, etc.), thermal energy, mechanical energy and nuclear energy and then convert these different forms of energy inputs into useable electrical power. The manufacture of these devices, although well established, can still be expensive and complicated. Most power generation today occurs from the irreversible combustion of fossil fuels and although this form of energy conversion is still less expensive than other types of electricity generation, the long term damage to the environment and human health is not currently born by the cost of energy production. In addition, the conversion of petroleum to electrical energy is estimated to be only 9% efficient. The cost of electricity produced from solar cells is still quite expensive when compared to fossil fuel based electrical power generation, and there remains the problem of energy storage in the absence of relevant light frequencies (night time). In addition, because of the photoelectric effect, solar cells can take advantage of only certain frequencies of sunlight, rendering their efficiency at around 11-30% of incident energy from the sun. Other types of energy conversion systems based on wind, hydroelectric, and nuclear energy input, while cost effective in some cases, still negatively impact the environment and/or may require large capital outlays. Other more exotic types of electrical generation devices such as thermoelectric, thermionic and magneto-hydrodynamic ones do not currently have the conversion efficiencies necessary to make them adaptable to mass electrical power production and in addition, are complicated to manufacture. Even with the current price of oil as of Oct. 2, 2006 hovering at $61/barrel, alternative forms of energy conversion are still not cost effective to produce and operate. Those forms of energy input (for example, coal and nuclear) that are considered cost competitive with petroleum-based energy inputs, create damage to the environment through the emission of greenhouse gases and particulates or through the production of radioactive waste.

OBJECTS AND ADVANTAGES

Accordingly, several objects and advantages of my invention are:

(a) to provide a method of electrical power generation which can be produced by a variety of materials that are readily available in most parts of the world;

(b) to provide a method of electrical power generation that is easily manufactured with age-old, continuous or batch, printing and painting techniques and without the need for expensive machining or manufacturing processes;

(c) to provide a method of electrical power generation that does not involve the emission of particulates, radioactive waste, greenhouse gases or other harmful pollutants;

(d) to provide a method of electrical power generation that operates both at very low temperatures (below room temperature) and at very high temperatures (above 3000 K) as well as, those in between;

(e) to provide a method of electrical power generation that does not necessarily require a constant feed of input power for conversion purposes;

(f) to provide a method of electrical power generation that merely requires the presence of heat in order to take advantage of the existing built-in potential, from the electrostatic force available between certain materials at their interfaces when they are joined;

(g) to provide a method of electrical power generation that can have very flat dimensions, so as to be incorporated unobtrusively into existing areas such as walls, car hoods, airplane fuselages, roads, etc.;

(h) to provide a method of electrical power generation that can be used in transportation vehicles, including but not limited to airplanes, bikes, cars, ships and trucks;

(i) to provide a method of electrical power generation where the power generation devices can be employed in familiar configurations already used by batteries, generators and capacitors to take advantage of already existing infrastructure.

Further objects and advantages are to provide a method of electrical power generation that can vary in size and scale to accommodate the power needs of smaller devices—such as radios, as well as larger entities, such as homes, towns and cities. Still further objects and advantages will become apparent from a consideration of the ensuing description and drawings.

SUMMARY OF THE INVENTION

The present invention, a new type of electrical power generation device, is based on layering of stabilized materials—oxides, semiconductors, metals and carbons, such that voltage differentials are manifested at the interface of the materials and an overall voltage value is exhibited between the anode and cathode outer layers of the device. The production of electricity from this device or cell is possible by exploiting built-in potential created across the interface between stable materials with dissimilar electron/hole configurations and densities.

DRAWINGS—FIGURES

DRAWINGS—REFERENCE NUMERALS

Figure 1A:
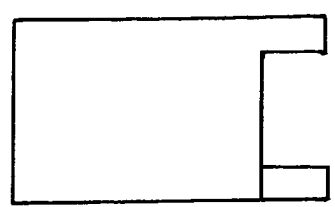
FIG. 1A is a two dimensional view of the most basic device cell as seen from the side of the cathode or anode.

20—metallic anode layer
21—applied or ceramic tile type oxide, carbide P-type material layer
22—applied or ceramic tile type carbon/graphite or N-type material
23—metallic cathode layer
24—metallic anode extrusion or connector or negative lead
25—metallic cathode extrusion or connector or positive lead
27—Internal resistance symbol of cell
28—Voltage source symbol of cell
31—Current line of Aluminum-Praseodymium Oxide—Graphite Cell
32—Current line of Aluminum-Praseodymium Oxide—Graphite Cell after removing load and resting 10 minutes.
33—Current line of Aluminum-Praseodymium Oxide—Graphite Cell after removing load and heating cell in boiling water 10 minutes.
34—Current line of Steel—Praseodymium Oxide—Graphite Cell with load
45—Voltage curve of layered and heat plastic sealed aluminum foil, praseodymium oxide and carbon graphite cell attached to a 100,000 ohm resistor.
46—Voltage curve of layered and heat plastic sealed aluminum foil, praseodymium oxide and carbon graphite cell attached to a 100,000 ohm resistor.after 10 minute rest from discharge measured by curve 45
47—Voltage curve of layered and heat plastic sealed aluminum foil, praseodymium oxide and carbon graphite cell attached to a 100,000 ohm resistor.after 2 minute immersion in boiling water and 10 minute rest.
48—Voltage curve of larger steel—Praseodymium oxide—carbon graphite—zinc coated steel cell attached to a 100,000 ohm resistor.
59—Fitted Voltage-current line against data plots for the steel, praseodymium oxide, carbon/graphite and zinc plated steel cell.
60—Thermally and electrically insulated container.
61—Thermally and electrically insulated container cap or lid.
62—Heating element—solenoid, nichrome element, inductive heater, etc.
63—Thermocouple
64—Thermally enhanceable solid state generator cells—power cells
65—Positive lead connecting power cells to controller circuit
66—Negative lead connecting power cells to controller circuit
67—Negative lead connecting controller circuit to heating element
68—Positive lead connecting controller circuit to heating element.
69—Connection between thermocouple to circuit
70—Positive connection of controller to external load
71—Negative connection of controller to external load
72—Controller circuit
81—P-type layer of cell
82—holes in P-type layer
83—N-type layer of cell
84—excess electrons in N-type layer
86—Positively charged ions in N-type layer at edge of depletion zone after losing electrons to P-type layer
87—Negatively charged ions in P-type layer at edge of depletion zone after gaining electrons from N-type layer
201—System clock to control temperature data sampling and buffer clearing cycle
202—Temporary buffer to hold Temperature Data
203—Logic Process to turn off Heating element based on logic decision output 204
204—Logic decision to test if rated temperature has been reached in cell system
205—Logic Process to turn on Heating element based on logic decision output 204
221—Thermally enhanceable solid state generator cell
223—Heat storage element or brick containing high heat capacity materials and painted a spectrum absorbent color
222—Sealed transparent Plastic or glass sleeve encasing cell 221 and heat storage absorber brick 223.
301—Applied Black body paint to facilitate absorption of electromagnetic waves.

DETAILED DESCRIPTION

The present invention, a new type of electrical power generation device, is based on the purposeful layering of different materials, oxides, semiconductors, metals and carbons, such that voltage differentials are manifested at the interface of the materials and an overall voltage value is exhibited between the anode and cathode of the device. The production of electricity from this device is caused by the creation of a built-in potential across the interface between stable materials with dissimilar electron configurations and densities. Once the correct series of layers are applied, the device may then be treated as any electrical power device and stacked in series or parallel, in order to reach a desired voltage or current output.

Electrons oscillate and emit electromagnetic energy in the form of waves. These waves possess a frequency distribution based on Planck's formula. Also, due to the connections between atoms, the displacement of one or more atoms from their equilibrium positions will give rise to a set of vibration waves propagating through the lattice. Since materials may contain both amorphous and crystalline components in their rigid states, the movement of electrons can result from, but not be restricted to photonic and phononic causes. In thermionic emission, electrons flow from the surface of a material and condense onto a dissimilar material, due to thermal vibrational energy overcoming the electrostatic forces which hold the electrons to the surface of the original material. The Seebeck effect instead deals with the manifestation of a voltage created in the presence of a temperature different metals or semiconductors. In photoelectric emission, electrons are emitted from matter when they absorb electromagnetic radiation that is above a threshold frequency.

When two dissimilar materials, with differing electron/hole densities, are brought into contact with each other, at the boundary between the two materials a built-in potential is formed. This occurs because of the diffusion of electrons and holes into regions with lower concentrations of electrons and holes. As recombination occurs, an electrical field eventually forms that opposes further recombination. The integration of this electric field over the depletion region between the two materials, determines the value of the built-in potential.

As free electrons gain kinetic energy due to the addition of heat from thermal or electromagnetic sources, more of them are able to migrate across the depletion zone and join with holes on the other side of the barrier region. The result is a widening depletion zone and an increased built-in voltage that is a linear function of junction temperature. If a load is connected across the two dissimilar materials, current flows. Ionic fluids present in the device's layers, facilitate further, the flow of electrons throughout the circuit.

When thermal equilibrium is reached, the built-in potential also reaches a constant and equilibrium value. At this point if a resistive load is applied across the terminals of the cell, the built-in potential acts as a charge pump, pushing current through the load. If the surface area of the cell is large enough or if resistive load is large enough, the current in the current will be small enough such that the rate of recombination across the depletion zone will be fast enough to allow the built-in potential and current to remain steady and indefinite. If however, the resistive load is too small or the surface area of the cell is too small, the rate of recombination, can not keep up with the power needs of the cell and the current will take on the shape found more in a capacitor device, ultimately deteriorating.

The combination of photonic, phononic and kinetically induced electron movement combined with the existence of a built-in potential across appropriately chosen materials results in a solid state electricity generator which demonstrates increasing voltage directly proportional to increasing temperature of the device and increasing current proportional to the fourth power of increasing temperature. Unlike in thermionic/thermoelectric devices, a temperature gradient is not necessary for the device to work and in fact the device produces electricity at room temperature, as long as the correct materials with certain determinate characteristics are chosen. Unlike, photoelectric devices, which depend on electromagnetic radiation that is above the threshold frequency of the specific material used, the device in question uses the thermal energy that exists within its materials to create a built-in potential, which will result in an electron flow when a load is applied to the cell.

In the preferred embodiment of the solid-state generator herein described, carbon graphite (circa 90% by volume but variable), Sodium Chloride (ionic solid-circa 10% by volume but variable) and optionally, small amounts of binders such as an acrylic polymer emulsion, as well as evaporable fluids (water) are mixed to form a thin paste or ink. This paste is then applied to a metal surface or foil to a sufficient and uniform thickness (thicknesses of 0.2-1.0 millimeters were employed although, greater thicknesses may be required depending on higher operating temperatures and higher required built-in potentials at those temperatures) and allowed to dry and then optionally heated to a temperature sufficient to cause it to cure into a more stable solid material (drying temperatures used were not in excess of 150 degrees Celsius but may be higher depending on the operating temperatures and conditions of device). Onto this dried layer of the first matrix is then applied the second paste of an oxide, sodium chloride, acrylic polymer emulsion binder (see above) and water matrix to a sufficient thickness ((again thicknesses of 0.2-1 millimeter were employed although, greater thicknesses may be required depending on operating conditions)). Before this second matrix layer is allowed to dry, a metal sheet or foil is applied onto this layer. This allows a much better adherence between the inner layers of the cell and the cathodes and/or anodes. This fundamental cell consisting of four layers: metal—carbon/graphite material—oxide—metal is allowed to dry and/or be heated to a high enough temperature that does not damage the cell, but cures to a more stable solid material (<150 Celsius). Once dried, the cell, depending on the expected operating minimum and maximum temperatures, may be allowed to absorb a fluid such as water, which will facilitate the conduction of charge carriers, by either combining with the electrolyte in the solid and dissolving it, or by actually being the primary electrolyte. The choice of ionic fluids is dependent on the operating temperature of the cell. Cells that will operate at a higher temperature than the evaporation point of the electrolyte, must be sealed and pressurized to ensure that the ionic fluids do not escape. When the cell has absorbed a sufficient quantity of electrolytic fluid, it is then sealed, around the edges with the temperature appropriate, electrical and moisture insulating sealant to ensure the integrity of the cell. Sealants can include but not be limited to epoxy glues, heat treated plastics, electrical tape or other types of sealants as well as ceramic glazes that cure below the melting temperature of the electrolyte. The cell will exhibit a voltage, as long as it remains at an operating temperature, that allows the electrolyte fluid to function but does not result in any of the other non electrolyte materials or metals in the cell, to reach their melting point. At this point, the immersion of the cell in different temperature baths will result in a proportional change in voltage. The cell does not need a temperature differential to work, but erogates based on the resistive load attached to it and the ambient temperature of the cell. The ideal resistive load allows the recombination of electrons and holes to occur at a rate that maintains a constant voltage and current.

Manufacturing and Materials Details

Since power output is directly proportional to the size of the surface area between the carbon and oxide layers, the metal substrate can be formed with many grooves, crinkles or ridges, and as the carbon and then oxide layers are applied, the grooving, crinkling or ridging continues through each applied layer, resulting in a higher surface area. The carbon paste or paint and the oxide paste or paint may be applied by the use of rollers, brushes, sprayers, screenprinting techniques, inkjet printers or any other method that allows the dispersion of ink or paint onto a surface. Although, the cells should work not only with amorphous materials but also more crystalline layers of carbon materials and oxides, the ability to simply apply the materials as a paste, should greatly decrease manufacturing costs and the use of expensive crystal growing and manufacturing technologies. One of the current drawbacks of current photo-electric and thermoelectric devices, is the need for clean rooms and highly sophisticated (read expensive) techniques and processes for crystal growth and device manufacture. In the prototypes created, the metal foils or sheeting used were aluminum, stainless steel and zinc-coated stainless steel. The carbon layer consisted of graphite mixed with sodium chloride, water and an acrylic binder. The oxide layers used were from each of the following metals: Praseodymium, Titanium, Tin, Nickel, Iron, Copper, Chromium, Manganese and also were mixed with sodium chloride, water and an acrylic binder. In terms of maximum voltage and current obtained at room temperature and ease of application, Praseodymium and Titanium Oxide were optimal. Finally, the entire cell was encased in a plastic sheet and heat sealed with anode and cathode contacts exposed. One basic cell was the size of a typical 8.5×11 in sheet of paper and the thickness of roughly 8 sheets of paper. It should be noted that cells made with Manganese oxide were able to be recharged and therefore can also serve as a charge storage device. In terms of operating temperature, different materials should and can be used. For example in the case of the cell made with aluminum sheets, praseodymium oxide and graphite, the operating temperature should be below the melting temperature of aluminum and should be much lower because of the presence of water. The use of a cell containing water as part of the ionic solution, implies that the operating temperature be below water's boiling point or that the cell, be externally pressurized in order to hold its integrity from expanding water vapor. A high temperature cell might include, tungsten (Melting Point 3695 K) as the cathodes and anodes, graphite (Melting Point 4300-4700 K) or another carbon material and thorium oxide (Melting Point 3573 K). The use of Sodium Chloride as the ionic fluid for charge carrier enhancement would allow a theoretical maximum operating temperature that is below, its 1738 degrees Kelvin boiling temperature. If a ionic fluid can be used with a melting point close to thorium oxide, then the maximum operating temperature would be somewhere below the 3573 K melting point of Kelvin. Note that a single one square meter cell using tungsten, graphite and thorium oxide erogating 100 micro amps at 1 volt (0.0001 watts) at room temperature would theoretically erogate at 3000 K around 1 Amp at 10 Volts (10 watts). Thus an increase in operating temperature from 300 K to 3000 K results in an 100,000 times increase in power output of a device. This assumes of course, that the ionic fluid works properly at this higher temperature.

A second embodiment also considers the use of ceramics that have been bisque fired into tiles. Onto these tiles may be applied the carbon paste and then the metal cathodes applied as above or simply held in place by pressure. Since in this case the oxide layer is in the form of a much more stable ceramic, operating temperatures can be higher. In any case, this embodiment should still be sealed to contain the electrolytic fluid.

Experimental Results

Figure 1B:
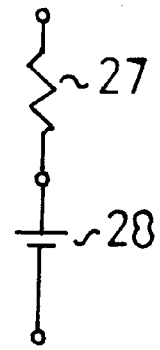
FIG. 1B is the theoretical electric circuit equivalent of the cell.
Figure 1C:
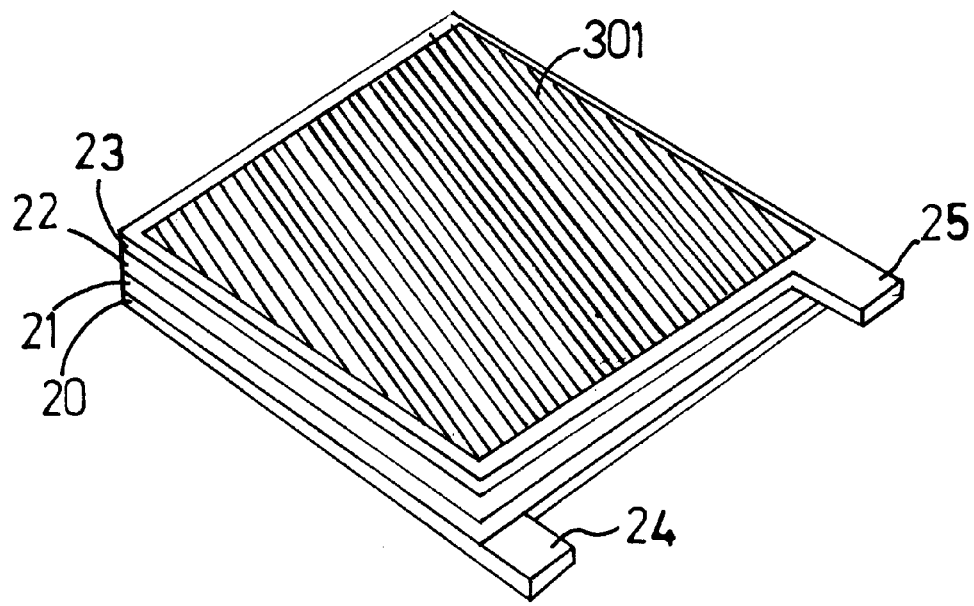
FIG. 1C is a perspective view of the most basic device cell, constructed in one shape in accordance to the description of the invention.

FIG. 1C is a perspective view taken from the corner of a cell. A conductive sheet or foil 20 is used as a base onto which is applied any donor material 21 at a proper thickness that will manifest a voltage difference across interface between the conductor 20 and the donor material 21. Conductors used for sheet or foil 20 include but are not limited to aluminum, copper, iron, steel, stainless steel, zinc-coated stainless steel and carbon plates. Additional conductors could include any of the other metals or metallic alloys not already mentioned. The donor material 21 can be but is not limited to the materials tested so far which exhibited a voltage differential and good conductivity-Praseodymium oxide mix containing also zirconium and silica compounds, Chromium Oxide and Silicon Carbide. Voltages manifested at the interface between sheet or foil 20 and donor material 21 are also influenced by the presence of moisture content or other charge carrier enabling fluids and compounds. Titanium Oxide, Zinc Oxide, Tin Oxide, Aluminum Oxide, Cuprous Oxide, Cupric Oxide and Fe2O2 Iron Oxide all manifested discernible voltages with the addition of a charge carrier fluid consisting of the following ingredients in any proportion: water, propylene glycol and sodium chloride. The charge carrier (ionic) fluid can consist of any fluid that enables the development of the interface voltage between sheet or foil 20 and donor material 21. Propylene Glycol and salt increases the temperature range over which the ionic fluids stay liquid and in motion. Onto layer 23, the donor material, is applied the layer 22 which should not be the same conductor as layer 20 since the voltage created would be the same as that between layers 20 and 21, thus canceling out any voltage potential created at the interface between layers 21 and 22, once the three layers 20, 21, 22 are formed together. Instead an effective conductor for layer 22 was determined to be a graphite paste, containing graphite, water and an acrylic binder used for making paints. Other carbon powders can work just as graphite has. The graphite paste created a voltage potential of 1 volt between layers 20 and 22. Layer 23 can be the same metal as that used in layer 20. In the case of an aluminum, praseodymium oxide, graphite, aluminum layered cell, the positive lead is denoted by 25 in FIG. 1C and the negative lead is denoted by 24 in FIG. 1C. The theoretical electric symbol of the cell is denoted by FIG. 1B, where the internal resistance of the cell 27 is in series with the voltage potential 28.

Figure 3:
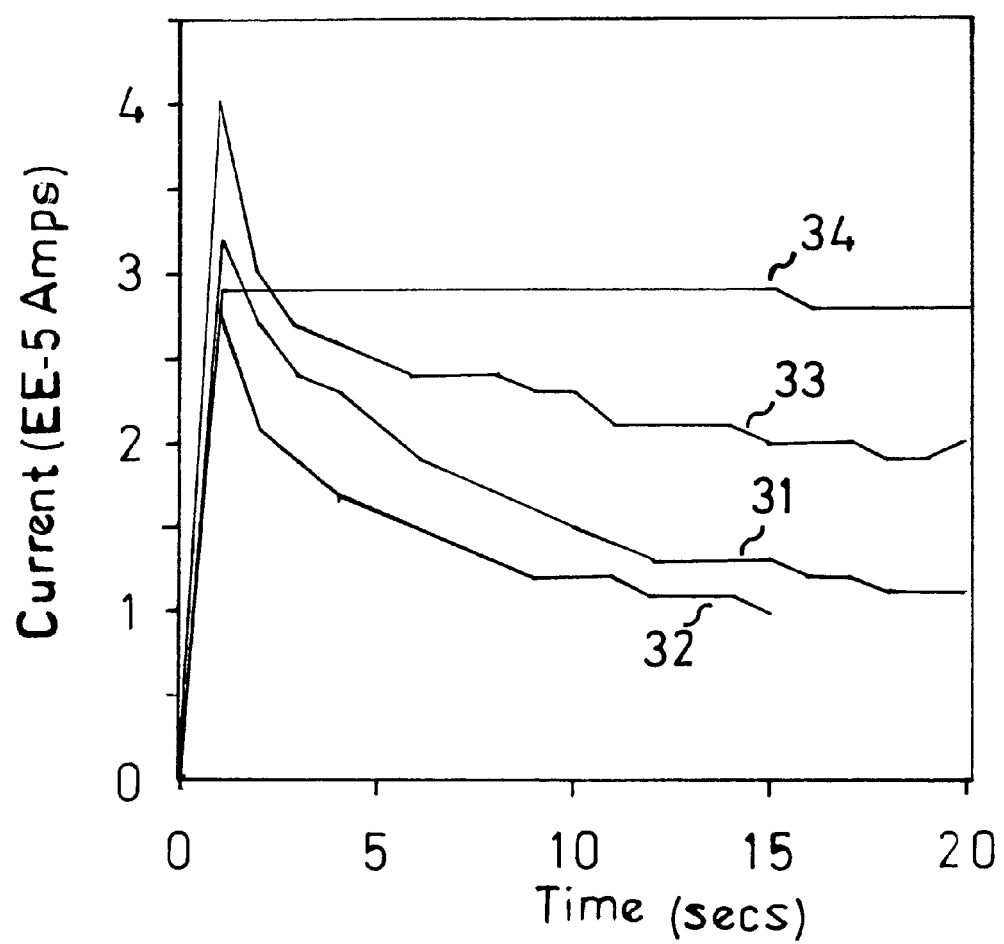
FIG. 3 is a graph showing the current flow of two actual cells after different heat treatments.

FIG. 3. shows the current flow as a function of time for three different scenarios (graphed line 31, 32 and 33) of a layered and heat plastic sealed aluminum foil, praseodymium oxide and carbon graphite cell attached to a 100,000 ohm resistor. Also is shown the current flow (graphed line 34 of FIG. 3) of a larger steel—Praseodymium oxide—carbon graphite—zinc coated steel cell attached to a 100,000 ohm resistor.

Graphed current line 31 shows the current spiking to 3.2 EE-5 Amps from zero and then descending at a descending rate.

Graphed current line 32 shows the current spiking to 2.8 EE-5 Amps from zero and then descending at a descending rate. This was after the cell was rested for 10 minutes.

Graphed current line 33 shows the current spiking to 4 EE-5 Amps from zero and then descending at a descending rate. This was after the cell was heated vigorously in boiling water for a few minutes.

Graphed current line 34 shows the current rising to 2.7 EE-5 Amps at room temperature for the larger steel cell. The current here is steadier and descends more slowly. This is a function of the surface area of this cell, which allows electrons to move across the depletion zone more readily.

Figure 4:
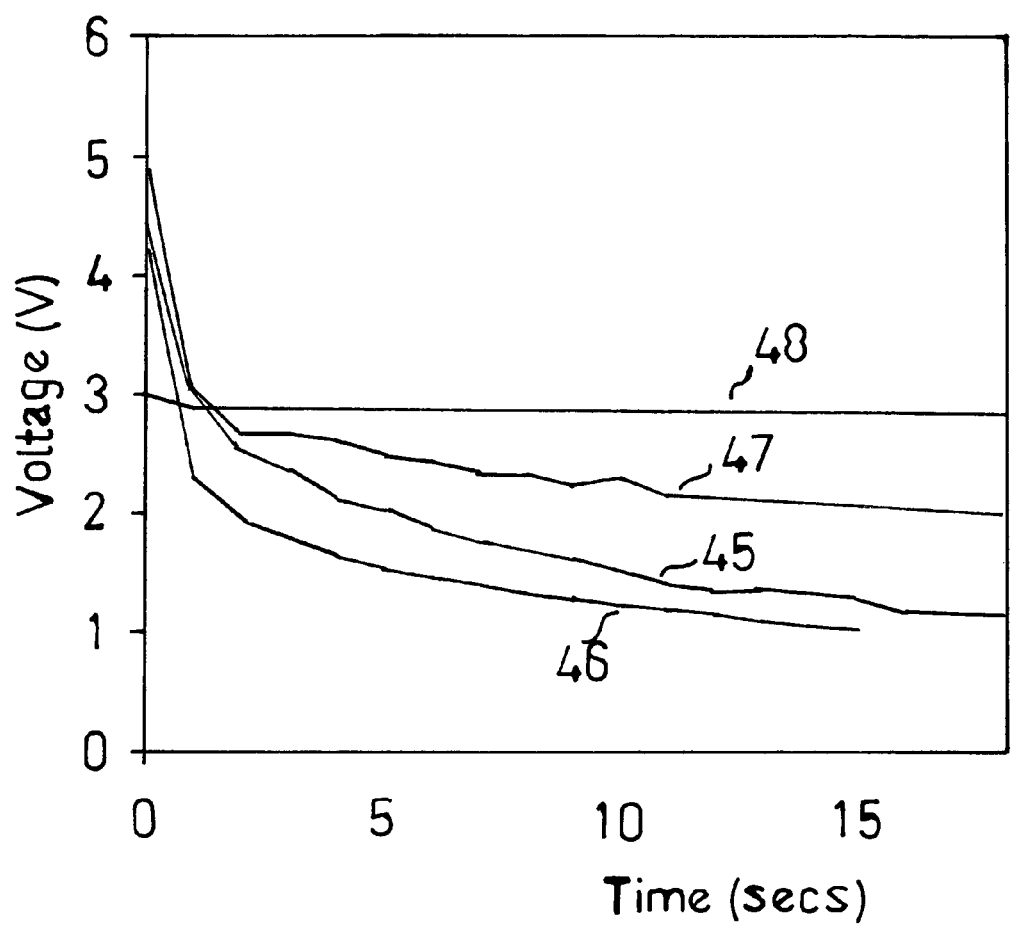
FIG. 4 is a graph showing the voltage of two actual cells after different heat treatments.

FIG. 4. Shows the voltage as a function of time for three different scenarios (graphed lines 45, 46 and 47) measured across a layered and heat plastic sealed aluminum foil, praseodymium oxide and carbon graphite cell attached to a 100,000 ohm resistor. Also is shown the voltage measured as a function of time 48 of a larger steel—Praseodymium oxide—carbon graphite—zinc coated steel cell attached to a 100,000 ohm resistor.

Graphed voltage line 45 shows the open circuit voltage at time zero equal to 4.5 volts. When the circuit is closed with a 100,000 ohm resistor, the voltage descends downward at a descending rate.

Graphed voltage line 46 shows the open circuit voltage at time zero equal to 4.2 volts. When the circuit is closed with a 100,000 ohm resistor, the voltage descends downward at a descending rate. This result was after the cell was rested for 10 minutes from the earlier discharge shown in Voltage line 45 and current line 31 of FIG. 3.

Graphed voltage line 47 of FIG. 4 shows the open circuit voltage at time zero equal to 4.9 volts. When the circuit is closed with a 100,000 ohm resistor, the voltage descends downward at a descending rate. This result was after the cell was heated vigorously in boiling water for 2 minutes and rested (open circuit) for 10 minutes.

Graphed voltage line 48 of FIG. 4 shows the room temperature open circuit voltage at zero equal to 3 volts for the larger steel—praseodymium oxide—carbon/graphite—zinc coated steel cell. When the circuit is closed with a 100,000 ohm resistor, the voltage descends downward at a very slow rate. This cell was considerably larger in area than the cell used in voltage plots 45 through 47 and discharges much more slowly while recharging itself more quickly.

It bears repeating, that the amount of current that is erogable by the cell is directly proportional to the area of the interface between the layers in the cell. In addition, the current erogable by the cell is polynomially proportional to the ambient temperature of the cell. These two most important factors for a given cell structure should be taken into account when a cells dimensions are being determined. When space is at a premium, the ambient temperature of the cell should be maximized. When space is not at a premium, then more consideration can be given to a larger cell array operating at lower temperatures.

Figure 5:
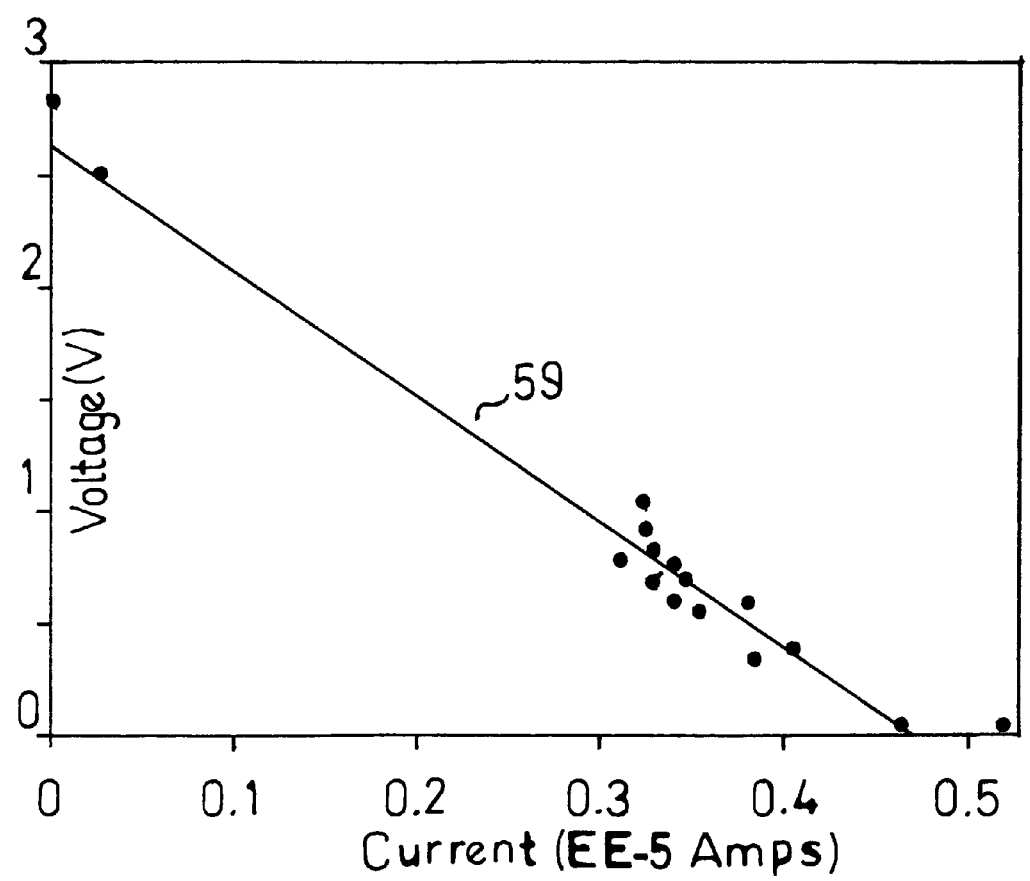
FIG. 5 shows the best fit Voltage-Current line against the sample points from the Steel, Praseodymium oxide, carbon/graphite and zinc-plated steel cell with different resistive loads attached.

FIG. 5, shows the Voltage-current graph for the steel, praseodymium oxide, carbon/graphite and zinc plated steel cell. The Voltage-current line 59 for this particular cell at room temperature is as follows:

$$V = -5.6356 \ast I + Voc$$

OR $$V = -5.6356 I + 2.64$$

Given that power $P = V \times I$,
We have $P = -5.6356 \ast I^2 + Voc \ast I$
$dP/dI = -5.6356 \ast 2 \ast I + Voc$
equating $dP/dI = 0$ ans solving for 1 we get $Imax = -Voc/(5.6356 \ast 2) = 2.64/(5.6356 \ast 2) = 0.23423$ EE-5 Amps
This is the current at which Power output is maximized and would result from a load of $Rmax = (-5.6356 \ast Imax + Voc)/Imax = 563560$ Ohms.

Figure 2:
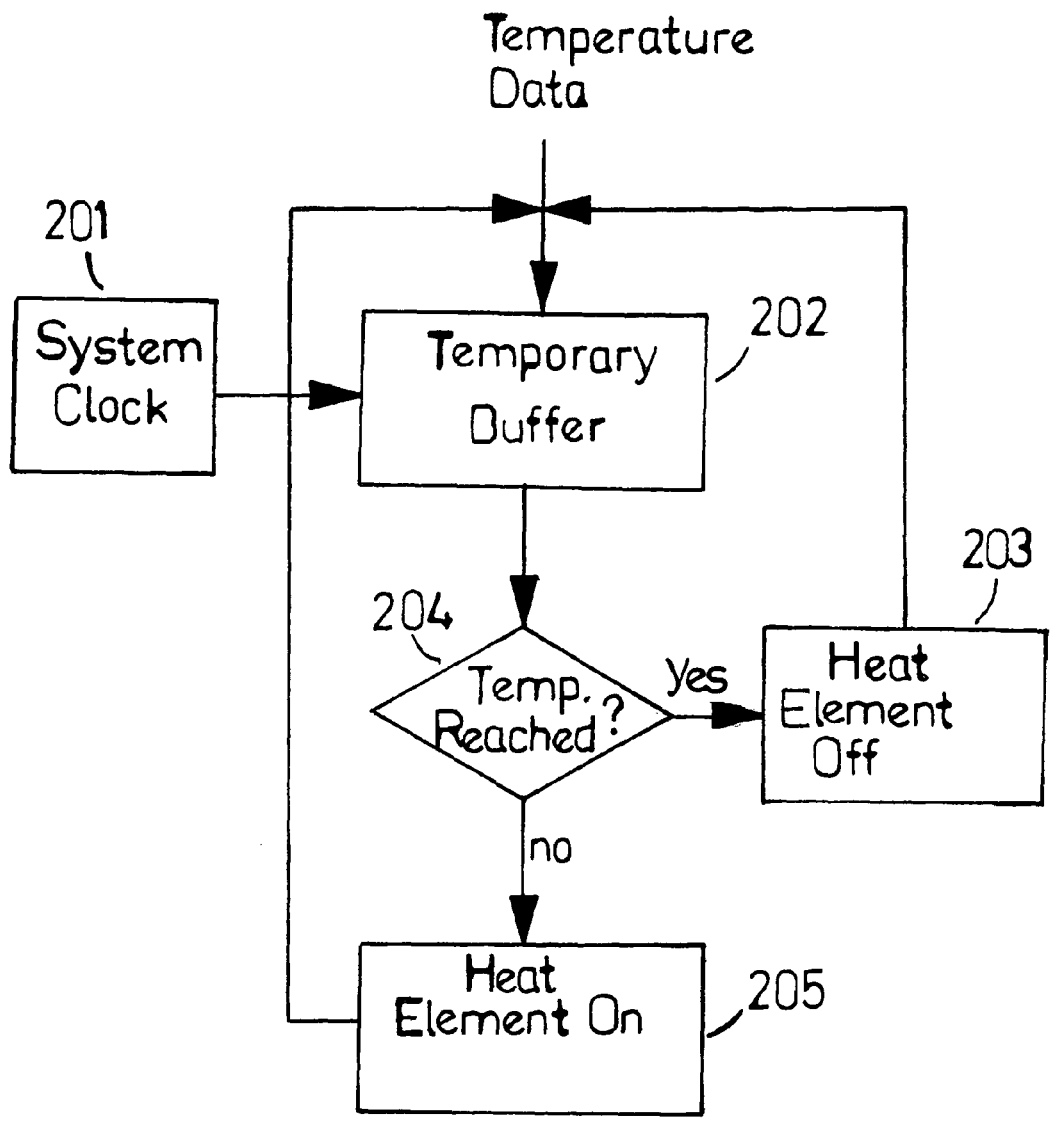
FIG. 2 is a flow chart showing how ambient cell temperatures are managed in an encapsulated or insulated scenario.
Figure 6:
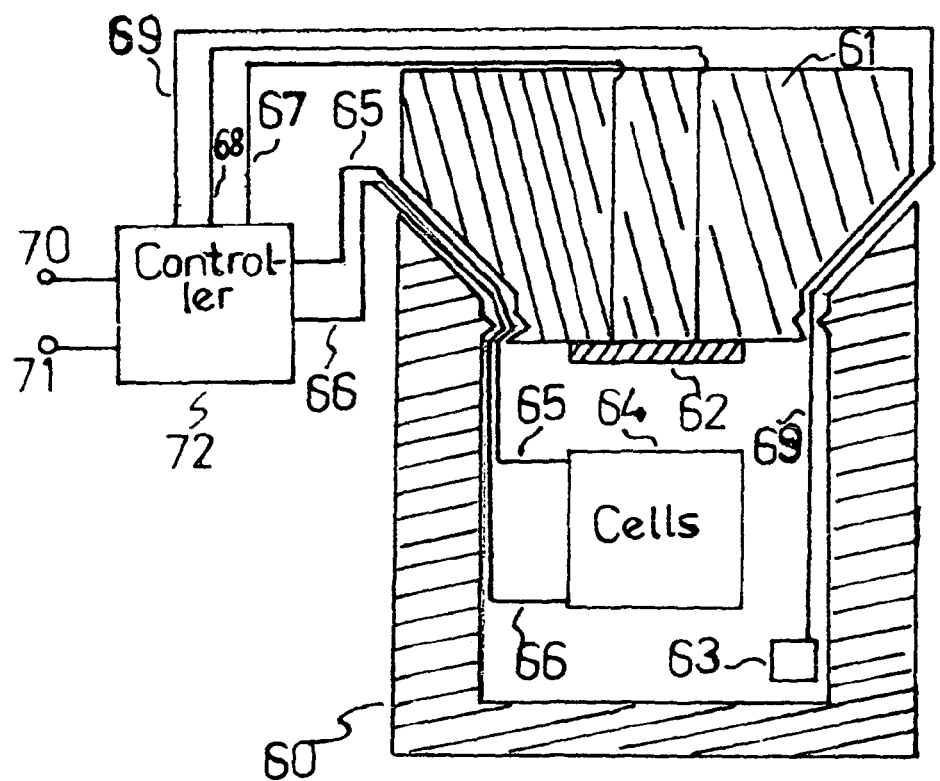
FIG. 6 is a lateral cross-sectional schematic view of a power cell device contained in an insulative type container such as a Dewar's Flask or a ceramic container, with controller circuit, as well as thermocouple and heating element.
Figure 7A:
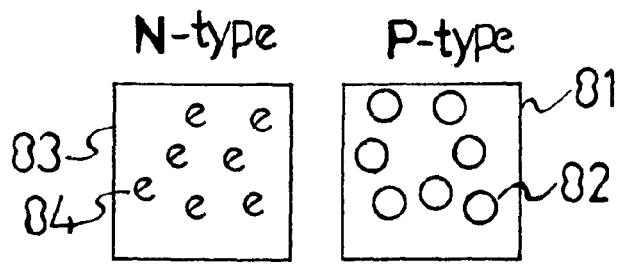
FIG. 7A is an illustrative schematic of charge behaviors prior to joining the carbon and oxide layers of the device.
Figure 7B:
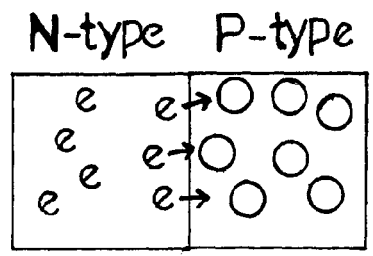
FIG. 7b is a schematic representation of charge behaviors immediately after joining the carbon and oxide layers of the device.
Figure 7C:
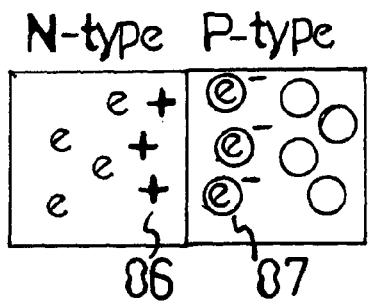
FIG. 7c is a schematic representation of charge behavior at thermal equilibrium after joining the carbon and oxide layers of the device.
Figure 7D:
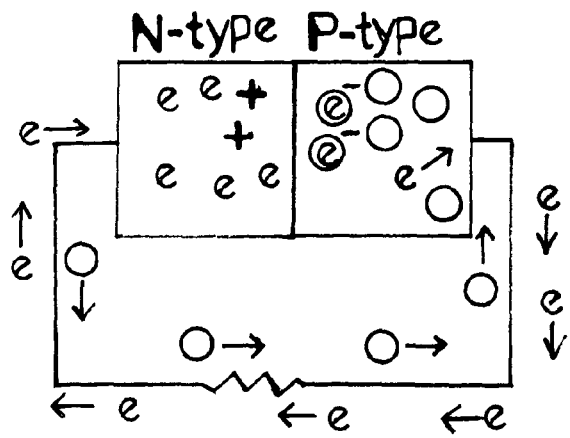
FIG. 7d is a schematic representation of charge behavior throughout cell, when a resistive load is attached across the joined carbon and oxide layers of the device.

FIG. 6 is a lateral cross-sectional view of several stacked power cells in series 64 contained in an insulated container 60 with an insulating lid 61. The stacked cells 64 have positive 65 and negative 66 leads that come out of the container 60 and attach to a controller circuit 72. The logic of the controller circuit is illustrated in FIG. 2. The controller circuit 72, uses power from the cells through the leads 65 and 66. The controller circuit measures temperature through a connection 69 to a thermocouple device 63. To maintain the rated voltage across leads 70 and 71, the controller circuit 72 uses the power from the cell 64 to increase the temperature in the insulated container 60, 61 by heating the inside of the container 60 through the use of the solenoid 62 attached to the leads 68 and 67. The controller cell 72 is preprogrammed to cause an optimal temperature rise, as well as, prevent the overheating of the insulated container's 60 cavity. Note that the drop in temperature of the inside of the container 60, 61 would be due to the effects of conduction of heat out of the container through the walls, wires and lid of the container and not through the conversion of heat into electricity.

Integration of Cells into Energy Systems

Because of the absence of a need for a temperature differential, many interesting system designs can be employed for the use of the herein mentioned cell.

A number of cells, connected in series or parallel can be placed together and will supply energy in the form of Direct Current to various uses. An inverter should be used to convert DC to AC current where necessary. Because, the built-in voltage cells varies with temperature, a DC-to-DC converter to furnish predictable DC voltage will be necessary.

Figure 8:
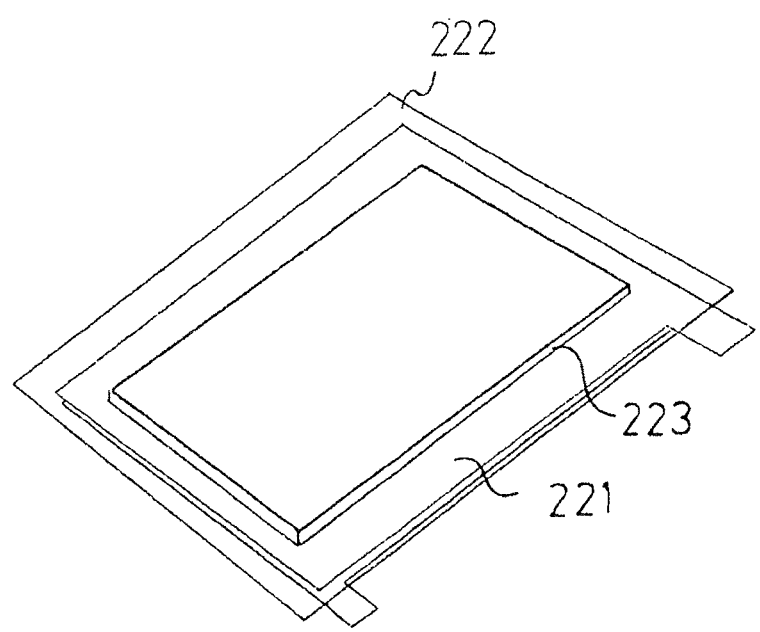
FIG. 8 is an oxide carbon cell encased/heat sealed in glass or plastic sheets with a black body absorber and heat storage panel.

Cells in various combinations can be encased in a heat trap, to produce higher working voltages and power output. In the case of electromagnetic radiation (sunlight, artificial light, etc.), the cells may be placed in a light absorbing medium which converts light to heat. See FIG. 8—an oxide carbon cell encased in glass or plastic with black body absorber that converts sunlight to heat and stores it.

The efficiency of any system employing these cells, will depend on the ability of the system to store heat and prevent its loss away from the cells. Cells may be used in a cascading manner by which outer cells, convert ambient heat to electricity, which is then converted to heat at the center most cells. In this way, cells themselves are used as the insulating medium, moving heat up stream to warmer areas. In addition, a completely encapsulated or isolated system would result in a extremely efficient generator, in that heat could be incorporated into the system in a contactless manner, through the use of induction heating and a susceptor. The correct material used as the encapsulant would greatly reduce the loss of heat energy. Encapsulants could include ceramics, plastics, epoxies and acrylics. See FIG. 6 for a logical design of a isolated/encapsulated system diagram.

The device generates electricity at room temperature. Immersing the device into a heat bath causes a proportional rise in voltage (proportional to device temperature in Kelvin) and an exponential rise in current. Consequently, lowering ambient temperature of the device reduces the manifested voltage. Because of the heat—voltage—power characteristics, a more efficient system would be to keep the device in an insulated container or embedded in a thermally and electrically insulating material. The ambient temperature inside the container could be increased, depending on the power outputs needs, by the use of an inductive heater. To avoid losing heat inside the device from conduction through the output wires, power could be extracted from the device by converting its current from direct to alternating and using a transformer device to extract current from the generated magnetic field.

What is claimed is:

1. A method for forming an energy generating device comprising the steps of:

forming a generator comprising at least one cell, the at least one cell comprising a first electrode and a second electrode, wherein the first electrode comprises a first layer of a first solid, planar binder material formed as a first paste or ink on a first conductive base in direct contact with the second electrode comprising a second layer of a second solid, planar binder material formed as a second paste or ink on a second conductive base, the first and second conductive bases in electrical contact with a power circuit;

drying the first and second pastes or inks;

absorbing or incorporating an ionic material into the first and second layers of the at least one cell to facilitate the flow of electrons from a first side of the at least one cell to a second side of the at least one cell, thereby creating at least one cell with an electric potential across an interface of the first and second layers of material;

wherein the first and second conductive bases are formed of a material selected from the group consisting of aluminum, copper, iron, stainless steel, zinc-coated stainless steel, carbon plates and tungsten; and wherein the first layer of material comprises carbon and the second layer of material is selected from the group consisting of praseodymium oxide, zirconium oxide, silica, titanium oxide, zinc oxide, tin oxide, nickel oxide, iron oxide, copper oxide, cuprous oxide, cupric oxide, chromium oxide, manganese oxide, thorium oxide, aluminum oxide and silicon carbide.

2. The method for forming an energy generating device of claim 1, wherein the ionic material is a liquid or a solid.

3. The method for forming an energy generating device of claim 1, wherein the ionic material consists of the following ingredients in any proportion: water, propylene glycol and sodium chloride.

4. The method for forming an energy generating device of claim 1, further comprising the step of encapsulating the at least one cell in glass, plastic, ceramic, epoxy or acrylic.

5. The method for forming an energy generating device of claim 1, further comprising the step of adding a heat storage element.

6. The method for forming an energy generating device of claim 1, further comprising the step of adding an insulative sealant around the at least one cell.

7. The method for forming an energy generating device of claim 1, further comprising the step of adding a black body absorber to the at least one cell.

8. The method for forming an energy generating device of claim 1, further comprising the step of adding a heating element to heat the at least one cell.

9. A method for forming an energy generating device comprising the steps of:

forming a generator comprising at least one cell, the at least one cell comprising a first electrode and a second electrode, wherein the first electrode comprises a first layer of a first solid, planar binder material formed as a first paste or ink on a first conductive base in direct contact with the second electrode comprising a second layer of a second solid, planar binder material formed as a second paste or ink on a second conductive base, the first and second conductive bases in electrical contact with a power circuit;

wherein at least one of the first and second electrodes is formed as a tile;

absorbing or incorporating an ionic material into the first and second layers of the at least one cell to facilitate the flow of electrons from a first side of the at least one cell to a second side of the at least one cell, thereby creating at least one cell with an electric potential across an interface of the first and second layers of material;

wherein the first and second conductive bases are formed of a material selected from the group consisting of aluminum, copper, iron, stainless steel, zinc-coated stainless steel, carbon plates and tungsten;

wherein the first layer of material comprises carbon and the second layer of material is selected from the group consisting of praseodymium oxide, zirconium oxide, silica, titanium oxide, zinc oxide, tin oxide, nickel oxide, iron oxide, copper oxide, cuprous oxide, cupric oxide, chromium oxide, manganese oxide, thorium oxide, aluminum oxide and silicon carbide.

10. The method for forming an energy generating device of claim 9, wherein the ionic material is a liquid or a solid.

11. The method for forming an energy generating device of claim 9, wherein the ionic material consists of the following ingredients in any proportion: water, propylene glycol and sodium chloride.

12. The method for forming an energy generating device of claim 9, further comprising the step of encapsulating the at least one cell in glass, plastic, ceramic, epoxy or acrylic.

13. The method for forming an energy generating device of claim 9, further comprising the step of adding a heat storage element.

14. The method for forming an energy generating device of claim 9, further comprising the step of adding an insulative sealant around the at least one cell.

15. The method for forming an energy generating device of claim 9, further comprising the step of adding a black body absorber to the at least one cell.

16. The method for forming an energy generating device of claim 9, further comprising the step of adding a heating element to heat the at least one cell.

* * * * *